US009443462B2

(12) United States Patent
Dong et al.

(10) Patent No.: US 9,443,462 B2
(45) Date of Patent: Sep. 13, 2016

(54) GATE DRIVING CIRCUIT, GATE LINE DRIVING METHOD AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiangdan Dong, Beijing (CN); Young Yik Ko, Beijing (CN); Weiyun Huang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 27 days.

(21) Appl. No.: 14/368,582

(22) PCT Filed: Dec. 17, 2013

(86) PCT No.: PCT/CN2013/089616
§ 371 (c)(1),
(2) Date: Jun. 25, 2014

(87) PCT Pub. No.: WO2015/035728
PCT Pub. Date: Mar. 19, 2015

(65) Prior Publication Data
US 2015/0302790 A1  Oct. 22, 2015

(30) Foreign Application Priority Data
Sep. 12, 2013  (CN) .......................... 2013 1 0415149

(51) Int. Cl.
G09G 5/00 (2006.01)
G09G 3/20 (2006.01)
G11C 19/28 (2006.01)
H03K 5/15 (2006.01)

(52) U.S. Cl.
CPC ............. G09G 3/2085 (2013.01); G11C 19/28 (2013.01); H03K 5/15093 (2013.01); *G09G 3/20* (2013.01); *G09G 2310/0202* (2013.01); *G09G 2310/0267* (2013.01); *G09G 2310/0286* (2013.01)

(58) Field of Classification Search
CPC ........ G09G 3/36; G09G 3/20; G09G 3/2085; G11C 19/28
USPC ............ 345/93, 173, 174, 214, 690; 326/93; 377/64
See application file for complete search history.

(56) References Cited

U.S. PATENT DOCUMENTS

| 7,317,780 | B2 * | 1/2008 | Lin ...................... G09G 3/3648 326/93 |
| 7,400,698 | B2 * | 7/2008 | Chang .................... G11C 19/28 377/64 |
| 2014/0079173 | A1 | 3/2014 | Yan et al. |

FOREIGN PATENT DOCUMENTS

CN  102708926 A  10/2012

OTHER PUBLICATIONS

International Search Report Appln. No. PCT/CN2013/089616; Dated Jun. 5, 2014.
International Preliminary Report on Patentability issued Mar. 15, 2016; PCT/CN2013/089616.

* cited by examiner

*Primary Examiner* — Calvin C Ma
(74) *Attorney, Agent, or Firm* — Ladas & Parry LLP

(57) ABSTRACT

The present disclosure relates to the field of display technique. There provides a gate driving circuit, a gate line driving method and a display device being capable of solving a technical problem of bad display caused by the interrupt of scanning signals in the time-sharing driven touch screen technology. The gate driving circuit includes multiple shift register units connected in series, a shift delay module being connected in series between j-th stage of shift register unit and (j+1)-th stage of shift register unit which are adjacent; wherein the shift delay module is connected to an output terminal of the j-th stage of shift register unit and an input terminal of the (j+1)-th stage of shift register unit and is further connected to the repeat output module; the repeat output module is connected to an output terminal of the (j−n+1)-th stage of shift register unit. The embodiments of the present disclosure are applied to the manufacture of a display.

20 Claims, 8 Drawing Sheets

GATE DRIVING CIRCUIT, GATE LINE DRIVING METHOD AND DISPLAY DEVICE

TECHNICAL FIELD

The present disclosure relates to the field of display technique, in particular to a gate driving circuit, a gate line driving method and a display device.

BACKGROUND

In the touch screen technology, a display scanning can be implemented in a time-sharing driving mode, i.e., performing a pixel scanning in a driving stage, stopping a scanning signal from being outputted in a touching stage and continuing to output the scanning signal to scan pixels after the touching stage terminates. A gate driving circuit in the prior art is in general composed of multiple shift register units connected in series and each of the multiple shift register units correspondingly outputs a driving signal for a gate line, and thus in the process of outputting the scanning signal, the interrupt of the scanning signal output will cause picture discontinuity due to a relatively long touching stage, thereby causing the occurrence of bad display of products.

SUMMARY

Embodiments of the present disclosure provide a gate driving circuit, a gate line driving method and a display device being capable of solving the technical problem of undesirable display caused by the interrupt of scanning signals in the time-sharing driven touch screen technology.

In order to solve the above technical problem, the embodiments of the present disclosure can adopt the following technical solutions:

In one aspect, there provide a gate driving circuit comprising multiple shift register units connected in series, a shift delay module being connected in series between j-th stage of shift register unit and (j+1)-th stage of shift register unit which are adjacent;

wherein the shift delay module is connected to an output terminal of the j-th stage of shift register unit and an input terminal of the (j+1)-th stage of shift register unit and is further connected to a repeat output module;

the repeat output module is connected to an output terminal of the (j−n+1)-th stage of shift register unit;

the shift delay module is configured to control, after a preset touch time terminates, the repeat output module to output a repeat scanning signal to the output terminal of the (j−n+1)-th stage of shift register unit after the j-th stage of shift register unit outputs a gate scanning signal, so that the scanning signals are output again to gate lines by the (j−n+1)-th stage of shift register unit to the j-th stage of shift register unit, where n is a positive integer greater than or equal to 1.

Optionally, when n is greater than or equal to 1, the repeat output module is further connected to a reference level terminal and configured to control by a voltage at the reference level terminal the repeat output module to stop outputting the repeat scanning signal to the output terminal of the (j−n+1)-th stage of shift register unit when the j-th stage of shift register unit outputs again the scanning signal.

Optionally, the repeat output module comprises an output unit and a pulling-down unit;

the shift delay module comprises i virtual shift register units connected in series, in which an input terminal of the first stage of virtual shift register unit is connected to the output terminal of the j-th stage of shift register unit, an output terminal of the first stage of virtual shift register unit is connected to the output unit, and an output terminal of the i-th stage of virtual shift register unit is connected to the pulling-down unit and the input terminal of the (j+1)-th stage of shift register unit, where i is equal to n and is a positive integer greater than 1;

wherein the output unit is used for outputting the repeat scanning signal to the output terminal of the (j−n+1)-th stage of shift register unit;

the pulling-down unit is further connected to the reference level terminal and an output control terminal of the first stage of virtual shift register and configured to control by the voltage at the reference level terminal the first stage of virtual shift register unit to stop outputting the repeat scanning signal through the output unit to the (j−n+1)-th stage of shift register unit.

Optionally, the repeat output module comprises an output unit and a pulling-down unit;

the shift delay module comprises i virtual shift register units connected in series, in which the input terminal of the first stage of virtual shift register unit is connected to the output terminal of the j-th stage of shift register unit, and an output terminal of the i-th stage of virtual shift register unit is connected to the pulling-down unit, the output unit and the input terminal of the (j+1)-th stage of shift register unit, where i is equal to 2;

wherein the output unit is used for outputting the repeat scanning signal to the output terminal of the (j−n+1)-th stage of shift register unit, where n is equal to 1;

the pulling-down unit is further connected to the reference level terminal and the output control terminal of the first stage of virtual shift register unit, and configured to control by the voltage at the reference level terminal the first stage of virtual shift register to output a signal to the next stage of virtual shift register unit, so as to control the output terminal of the i-th stage of virtual shift register unit to stop outputting the repeat scanning signal through the output unit to the output terminal of the (j−n+1)-th stage of shift register unit.

Optionally, the output unit comprises a first switch transistor, whose gate and source are connected to the shift delay module and drain is connected to the output terminal of the j-th stage of shift register unit;

the pulling-down unit comprises a second switch transistor, whose gate is connected to an output terminal of the n-th stage of virtual shift register unit, source is connected to the reference level terminal and drain is connected to a gate of a driving signal output transistor of a gate line in the first stage of virtual shift register unit.

Optionally, when n is equal to 1, the repeat output module is further connected to the reference level terminal and the output terminal of the (j+1)-th stage of shift register unit and configured to control by the voltage at the reference level terminal the repeat output module to stop outputting the repeat scanning signal to the output terminal of the j-th stage of shift register unit when the (j+1)-th stage of shift register unit outputs the scanning signal.

Optionally, the repeat output module comprises an output unit and a pulling-down unit;

the shift delay module comprises a first stage of virtual shift register unit, whose input terminal is connected to the output terminal of the j-th stage of shift register unit and output terminal is connected to the output unit and the input terminal of the (j+1)-th stage of shift register unit;

wherein the output unit is configured to output the repeat scanning signal to the output terminal of the j-th stage of shift register unit;

the pulling-down unit is further connected to the reference level terminal, the output terminal of the (j+1)-th stage of shift register unit and the output control terminal of the first stage of virtual shift register unit, and configured to control by the voltage at the reference level terminal the first stage of virtual shift register unit to stop outputting the repeat scanning signal to the output terminal of the j-th stage of shift register unit when the (j+1)-th stage of shift register unit outputs the scanning signal.

Optionally, the output unit comprises a first switch transistor, whose gate and source are connected to the shift delay module and drain is connected to the output terminal of the j-th stage of shift register unit;

the pulling-down unit comprises a second switch transistor, whose gate is connected to the output terminal of the (j+1)-th stage of shift register unit, source connected to the reference level terminal and drain is connected to a gate of a driving signal output transistor of a gate line in the first stage of virtual shift register unit.

The present disclosure provides a display device comprising the gate driving circuit described above.

On one aspect, there is provided a gate line driving method, when a shift delay module is located between j-th stage of shift register unit and (j+1)-th stage of shift register unit which are adjacent, comprising:

controlling by a shift delay module a repeat output module to output a repeat scanning signal to an output terminal of a previous corresponding (j−n+1)-th stage of shift register unit after a touch event time terminates; and outputting again the scanning signal to a gate line by the (j−n+1)-th stage of shift register unit to the j-th stage of shift register unit.

Optionally, the repeat output module stops outputting the repeat scanning signal to the output terminal of the (j−n+1)-th stage of shift register unit after the j-th stage of shift register unit outputs again the scanning signal or the (j+1)-th stage of shift register unit outputs the scanning signal.

The gate driving circuit and the gate line driving method provided in the present embodiments of the present disclosure can control, after the touching stage ends, the repeat output module through the shift delay module to repeatedly output the gate driving signal of the gate driving shift register unit before the touching stage, so as to solve the technical problem of undesirable display caused by the scanning signal interrupt in the time-sharing driven touch screen technology.

BRIEF DESCRIPTION OF THE DRAWINGS

In order to specify the technical solutions of the embodiments of the present disclosure clearer, below will be a simply introduction to the accompanying drawings needed to be used in the description of the embodiments. Obviously, the accompanying drawings described below are just a part of embodiments of the present disclosure.

DETAILED DESCRIPTION

Below will be a clear and complete description of the technical solutions in the embodiments of the present disclosure. Obviously, the embodiments described below are just a part of embodiments of the present disclosure rather than all the embodiments.

Transistors adopted in all the embodiments of the present disclosure are thin film transistors or field effect transistors or other devices with the same characteristics. Since sources and drains of the transistors adopted herein are symmetrical, there is no difference between the sources and drains are the same. In the embodiments of the present disclosure, in order to distinguish the two electrodes of the transistors other than the gates thereof, one of the two electrodes is referred to as a source and the other one thereof is referred to as a drain. It is described according to the forms in the figures that a middle terminal of the transistors is a gate, a signal input terminal thereof is a source, and a signal output terminal thereof is a drain. In addition, all the transistors adopted in the embodiments of the present disclosure are P or N type transistors. The P type transistor is turned on when the gate is at a low level, and the N type transistor is turned on when the gate is at a high level.

Figure 1:
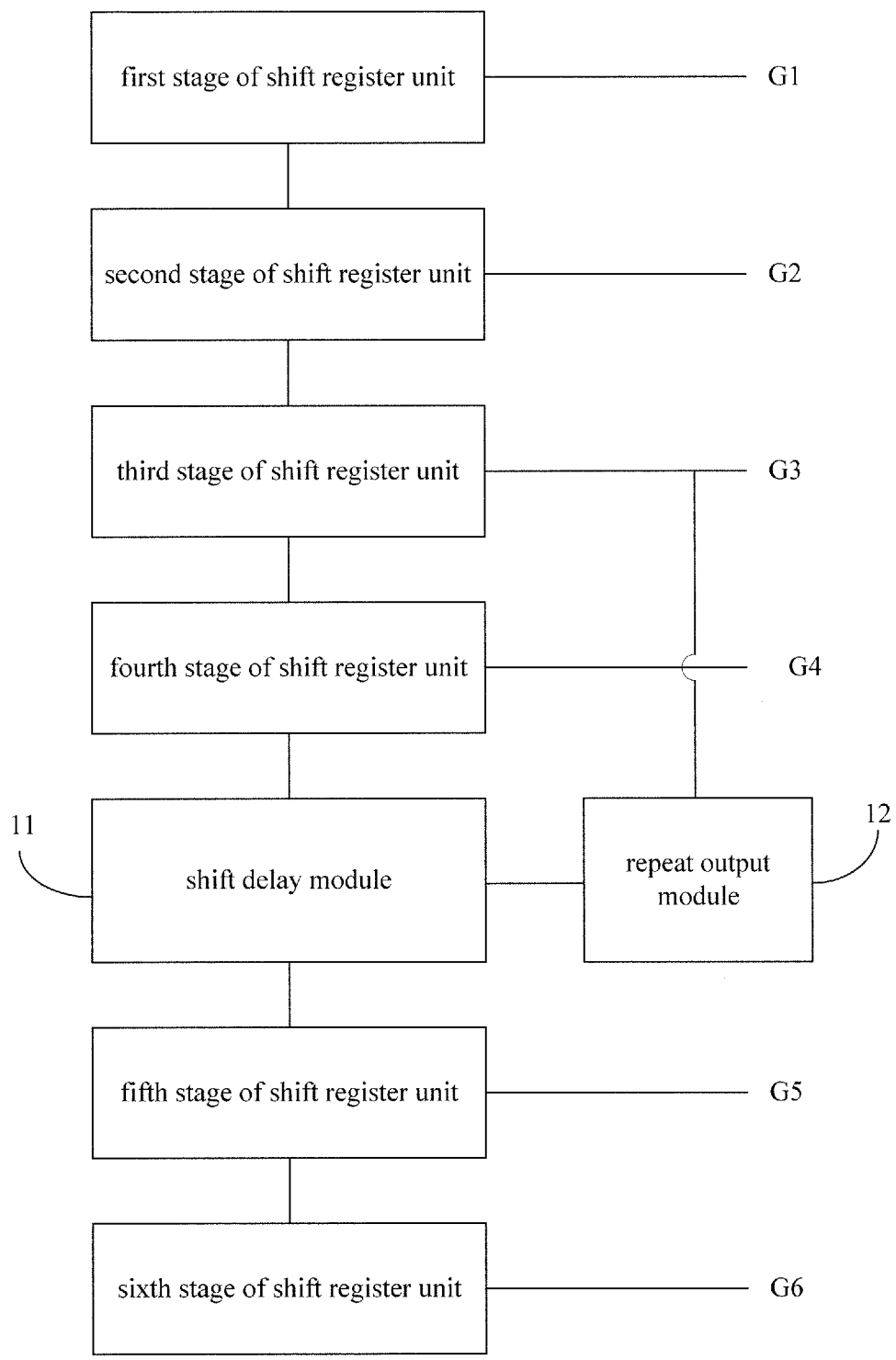
FIG. 1 is a schematic diagram of a structure of a gate driving circuit provided in an embodiment of the present disclosure.

As shown in FIG. 1, a gate driving circuit according to an embodiment of the present disclosure comprises multiple shift register units connected in series (FIG. 1 gives a specification by taking an first stage of shift register unit to a sixth shift register unit as an example);

a shift delay module 11 is connected in series between j-th stage of shift register unit and (j+1)-th stage of shift register unit which are adjacent (it is specified in the figure by taking j being equal to 4 as an example);

wherein the shift delay module 11 is connected to an output terminal of the j-th stage of shift register unit and an input terminal of the (j+1)-th stage of shift register unit and is further connected to a repeat output module 12;

the repeat output module 12 is connected to an output terminal of (j−n+1)-th stage of shift register unit;

the shift delay module 11 is used for controlling, after a preset touch time ends, the repeat output module 12 to output a repeat scanning signal to the output terminal of the (j−n+1)-th stage of shift register unit after the j-th stage of shift register unit outputs a gate scanning signal, so that the (j−n+1)-th stage of shift register unit to the j-th stage of shift register unit output again the scanning signal to a gate line, where n is a positive integer greater than or equal to 1. At the same time, referring to FIG. 1, each of the shift register units is connected with a corresponding gate line (G1-G6).

Optionally, FIG. 1 shows that the repeat output module 12 is connected to an output terminal of the third stage of shift register unit, so that gate lines G3 and G4 repeatedly output a scanning signal. Of course, the repeat output module 12 may also be connected to an output terminal of any stage of shift register unit prior to the fourth stage of shift register unit according to the specific requirements.

The gate driving circuit of the embodiment of the present disclosure can, after a touching stage terminates, control the repeat output module through the shift delay module to repeatedly output the gate driving signal of the gate driving shift register unit before the touching stage, so as to solve the technical problem of bad display caused by the interrupt of scanning signal in the time-sharing driven touch screen technology.

Figure 2:
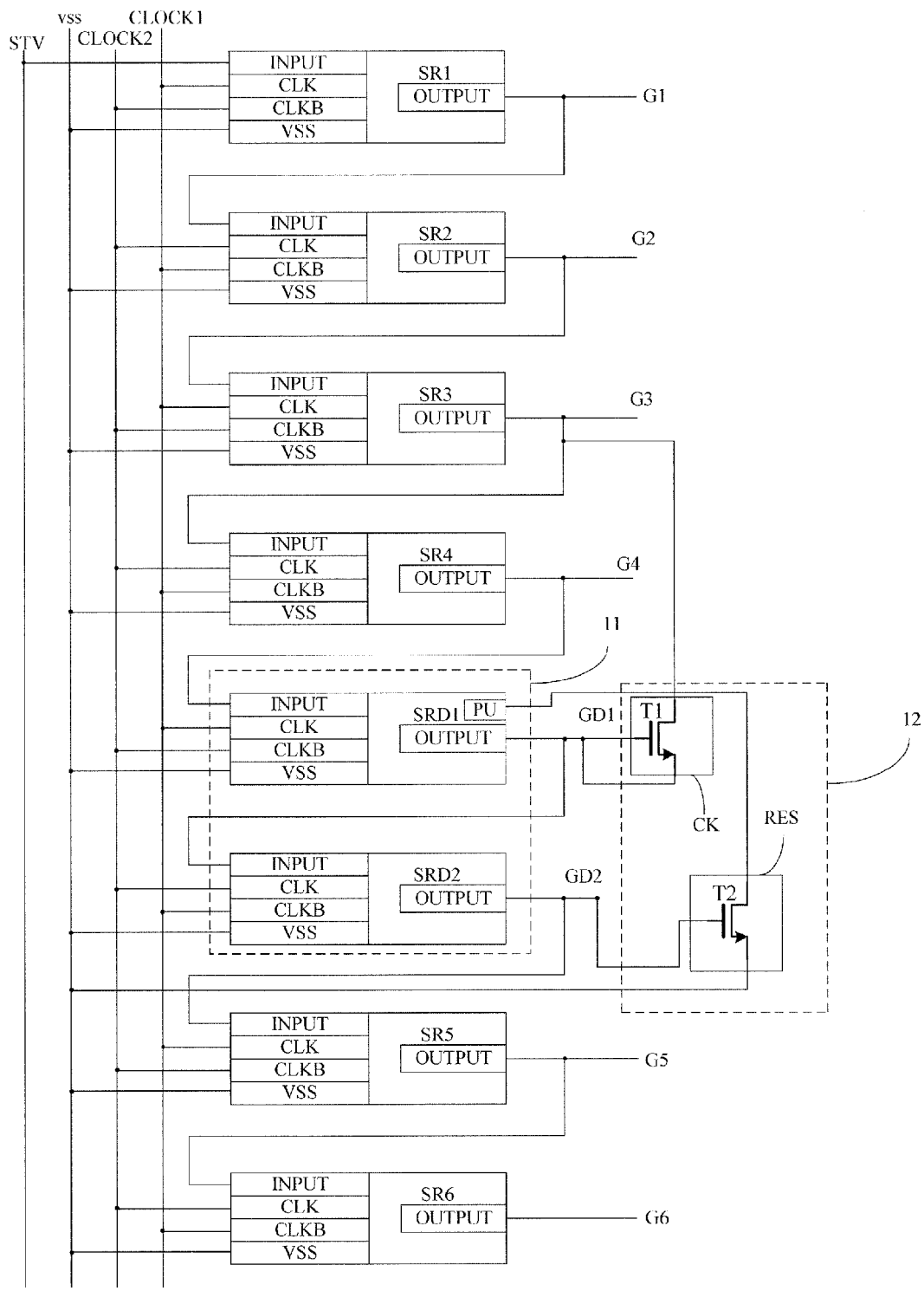
FIG. 2 is a schematic diagram of a structure of a gate driving circuit provided in another embodiment of the present disclosure.

As shown in FIG. 2, a gate driving circuit according to another embodiment of the present disclosure comprises multiple shift register gate driver on array (GOA) units connected in series.

Except for the first GOA unit and the last GOA unit, an output terminal of each GOA unit is connected to an input terminal of an adjacent next GOA unit, and an input terminal of each GOA unit is connected to an output terminal of an adjacent previous GOA unit; each of the shift register units further comprises a first clock signal terminal, a second clock signal terminal and a reference voltage terminal. In addition, an input terminal of an first shift register unit receives a frame start signal STV, an output terminal thereof is connected to a gate line, and an input terminal of the last shift register unit is connected to the output terminal of the adjacent previous shift register unit.

In the present embodiment, an output terminal of each gate driving shift register unit is connected to a gate line and provides a driving signal for the gate line. FIG. 2 illustrates by taking a shift register unit SR1 to a shift register unit SR6 as an example. A shift delay module 11 is connected in series between j-th stage of shift register unit and (j+1)-th stage of shift register unit which are adjacent, it is specified in FIG. 2 by taking j being equal to 4 as an example.

In FIG. 2, the shift delay module 11 is connected to an output terminal of the j-th stage of shift register unit and an input terminal of the (j+1)-th stage of shift register unit and is further connected to a repeat output module 12;

the repeat output module 12 is connected to an output terminal of (j−n+1)-th stage of shift register unit;

the shift delay module 11 is used for controlling, after a preset touch time terminates, the repeat output module 12 to output a repeat scanning signal to the output terminal of the (j−n+1)-th stage of shift register unit after the j-th stage of shift register unit outputs a gate scanning signal, so that the (j−n+1)-th stage of shift register unit to the j-th stage of shift register unit output again the scanning signal to a gate line, where n is a positive integer greater than or equal to 1. At the same time, referring to FIG. 1, each of the shift register units is connected to a corresponding gate line (G1-G6).

When n is greater than or equal to 1, the repeat output module 12 is further connected to a reference level terminal and configured to control the repeat output module 12 through a voltage at the reference level terminal to stop outputting the repeat scanning signal to the output terminal of the (j−n+1)-th stage of shift register unit when the j-th stage of shift register unit outputs repeatedly the scanning signal.

Optionally, as shown in FIG. 2, the repeat output module 12 comprises an output unit CK and a pulling-down unit RES;

the shift delay module 11 comprises i virtual shift register units connected in series, wherein an input terminal of the first stage of virtual shift register is connected to the output terminal of the j-th stage of shift register unit, and an output terminal of the first stage of virtual shift register is connected to the output unit, and an output terminal of the i-th stage of virtual shift register unit is connected to the pulling-down unit and the input terminal of the (j+1)-th stage of shift register unit, where i is equal to n and is a positive integer greater than 1;

wherein the output unit CK is used for outputting the repeat scanning signal to the output terminal of the (j−n+ 1)-th stage of shift register unit;

the pulling-down unit RES is further connected to the reference level terminal and an output control terminal of the first stage of virtual shift register and used for controlling the first stage of virtual shift register unit through the voltage at the reference level terminal to stop outputting the repeat scanning signal through the output unit to the output terminal of the (j−n+1)-th stage of shift register unit.

Specifically, the gate driving circuit as shown in FIG. 2 comprises a number of shift register units connected in series, wherein the output terminal OUTPUT of the shift register unit SR1 is connected to a gate line GI; the input terminal INPUT of the shift register unit SR2 is connected to the output terminal of the shift register unit SR1 and is connected to a gate line G2; the input terminal INPUT of the shift register unit SR3 is connected to an output terminal of the shift register unit SR2 and is connected to a gate line G3; the input terminal INPUT of the shift register unit SR4 is connected to the output terminal of the shift register unit SR3 and is connected to a gate line G4; the input terminal INPUT of the virtual shift register unit SRD1 is connected to the output terminal of the shift register unit SR4 and is connected to agate line GD1; the input terminal INPUT of the virtual shift register unit SRD2 is connected to the output terminal of the virtual shift register unit SRD1 and is connected to a gate line GD2; the input terminal INPUT of the shift register unit SR5 is connected to the output terminal of the virtual shift register unit SRD2 and is connected to a gate line G5; the input terminal INPUT of the shift register unit SR6 is connected to the output terminal of the shift register unit SR5 and is connected to a gate line G6. In addition, an output unit CK of the repeat output module 12 is connected to the output terminal of the virtual shift register unit SRD1 and the output terminal of the shift register unit SR3 and is used for controlling the output terminal of the shift register unit SR3 connected through the output unit CK to output a signal when the output terminal of the virtual shift register unit SRD1 corresponding to the output unit CK has a signal to be outputted; in this way, a repeat output of two stages of shift register units SR3 and SR4 can be realized after the touching stage terminates, so as to improve the picture quality.

In addition, the repeat output module 12 further comprises a pulling-down unit RES, which is connected to the output terminal of the virtual shift register unit SRD2, and further connected to an output control terminal PU of the virtual shift register unit SRD1, and the pulling-down unit RES is further connected to a reference voltage vss, and is used for controlling the virtual shift register unit SRD1 through the voltage at the reference voltage terminal to stop outputting a repeat scanning signal to the output terminal of the shift register unit SR3 through the output unit.

Each of the shift register units and the virtual shift register units comprises a first clock signal terminal CLK, a second clock signal terminal CLKB, and a reference voltage terminal VSS. Herein, for each stage of shift register unit and virtual shift register unit, the first clock signal terminal CLK receives a clock signal opposite to the clock signal at the second clock signal terminal CLKB. More particularly, the odd number stage of shift register units or the virtual shift register units receive a clock signal CLOCK1 at its first clock signal terminal CLK and receive a clock signal opposite to the clock signal CLOCK1 at its second clock signal terminal CLKB; the even number stage of shift register units or the virtual shift register units receive a clock signal CLOCK2 at its first clock signal terminal CLK and receive a clock signal opposite to the clock signal CLOCK2 at its second clock signal terminal CLKB; in addition, the clock signal CLOCK1 and the clock signal CLOCK 2 are opposite.

Figure 6:
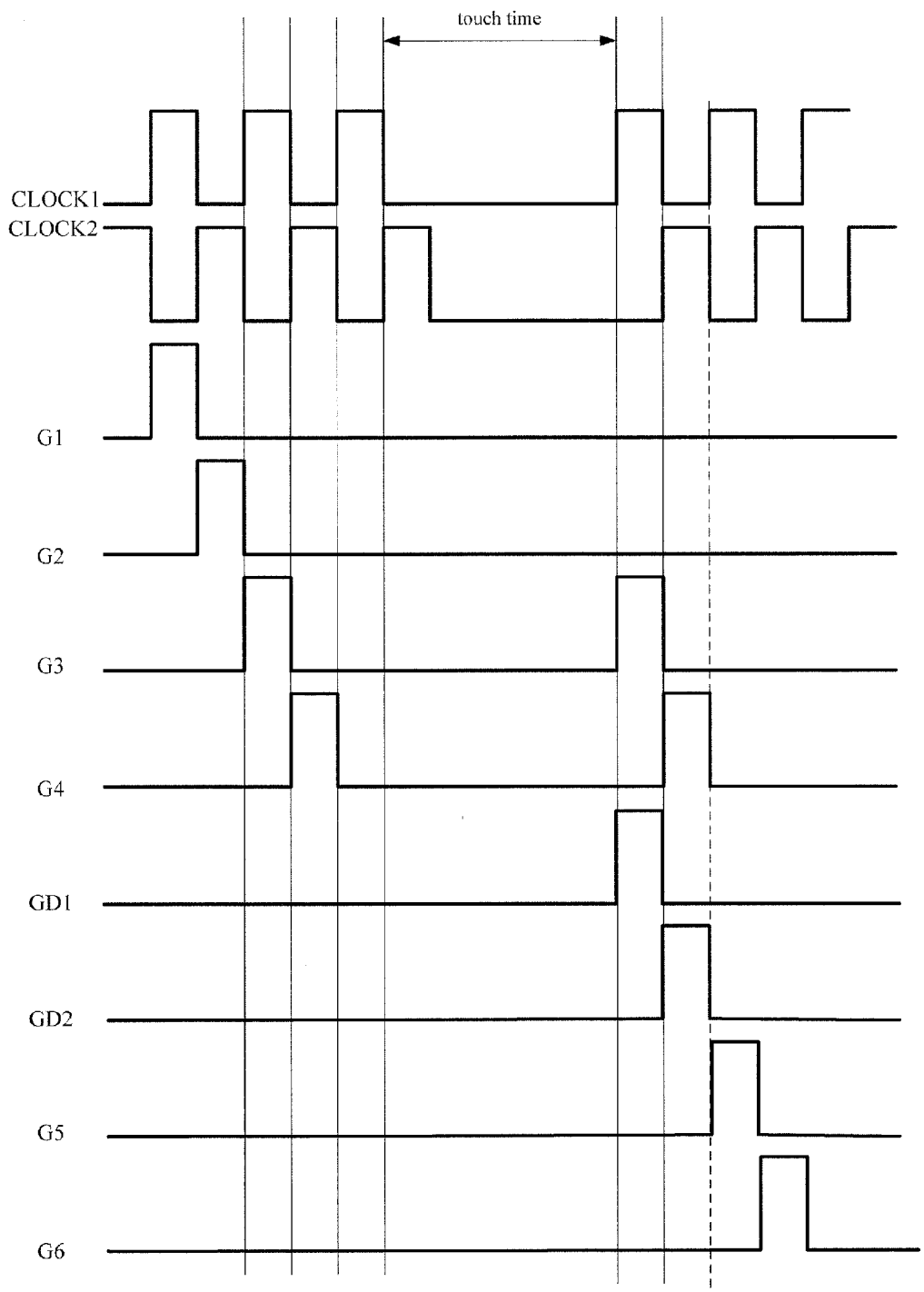
FIG. 6 is a schematic diagram of an output timing state of a gate driving method provided in an embodiment of the present disclosure.

Further, the first clock signal terminal CLK and the second clock signal terminal CLKB of each stage of shift register unit or virtual shift register unit obtains the clock signal by being connected to a system clock respectively. For example, FIG. 2 provides a connecting mode. The first clock signal terminal CLK of the odd number stage of shift register units or the virtual shift register units is connected to a system clock CLOCK1 and the second clock signal terminal thereof is connected to a system clock CLOCK2. The first clock signal terminal CLK of the even number stage of shift register units or the virtual shift register units is connected to a system clock CLOCK2 and the second clock signal terminal thereof is connected to a system clock CLOCK1. The reference voltage terminal VSS is connected to the reference voltage vss. Herein, referring to the signal timing diagram as shown in FIG. 6 (comprising an input terminal signal of each stage of shift register units, a group of system clock signals, i.e., the first clock signal CLOCK1 and the second clock signal CLOCK 2). Herein, at the touching stage, the system clock signal stop outputting; at the outputting stage, a duty ratio of both a high level or a low level of the system clock signals CLOCK1 and CLOCK2 is 1:1 (i.e., the duty ratio of CLOCK1 and CLOCK 2 is 50% respectively), that is, a low level signal of CLOCK2 starts after a low level signal of CLOCK1 terminates, and the next low level clock signal of CLOCK1 starts after the low level signal of CLOCK2 terminates, and this process is in cycle in such a way. The principle of the output of a high level signal is the same, thereby details omitted herein.

In the present embodiment, the first shift register unit is SR1, then the input signal INPUT of the GOA unit SR1 is an active pulse signal, optionally such as a frame start signal STV. The first system clock signal CLOCK1 starts to be outputted after the STV signal terminates.

Further, referring to FIG. 2, the output unit CK comprises a first switch transistor T1, whose gate and source are connected to the shift delay module and drain is connected to the output terminal of the (j−n+1)-th stage of shift register unit;

the pulling-down unit RES comprises a second switch transistor T2, whose gate is connected to the output terminal of the n-th virtual shift register unit, a source is connected to the reference level terminal and a drain is connected to the output control terminal PU of the first stage of virtual shift register unit SRD1 (for example, a gate of a driving signal output transistor of a gate line in the first stage of virtual shift register unit).

Figure 3:
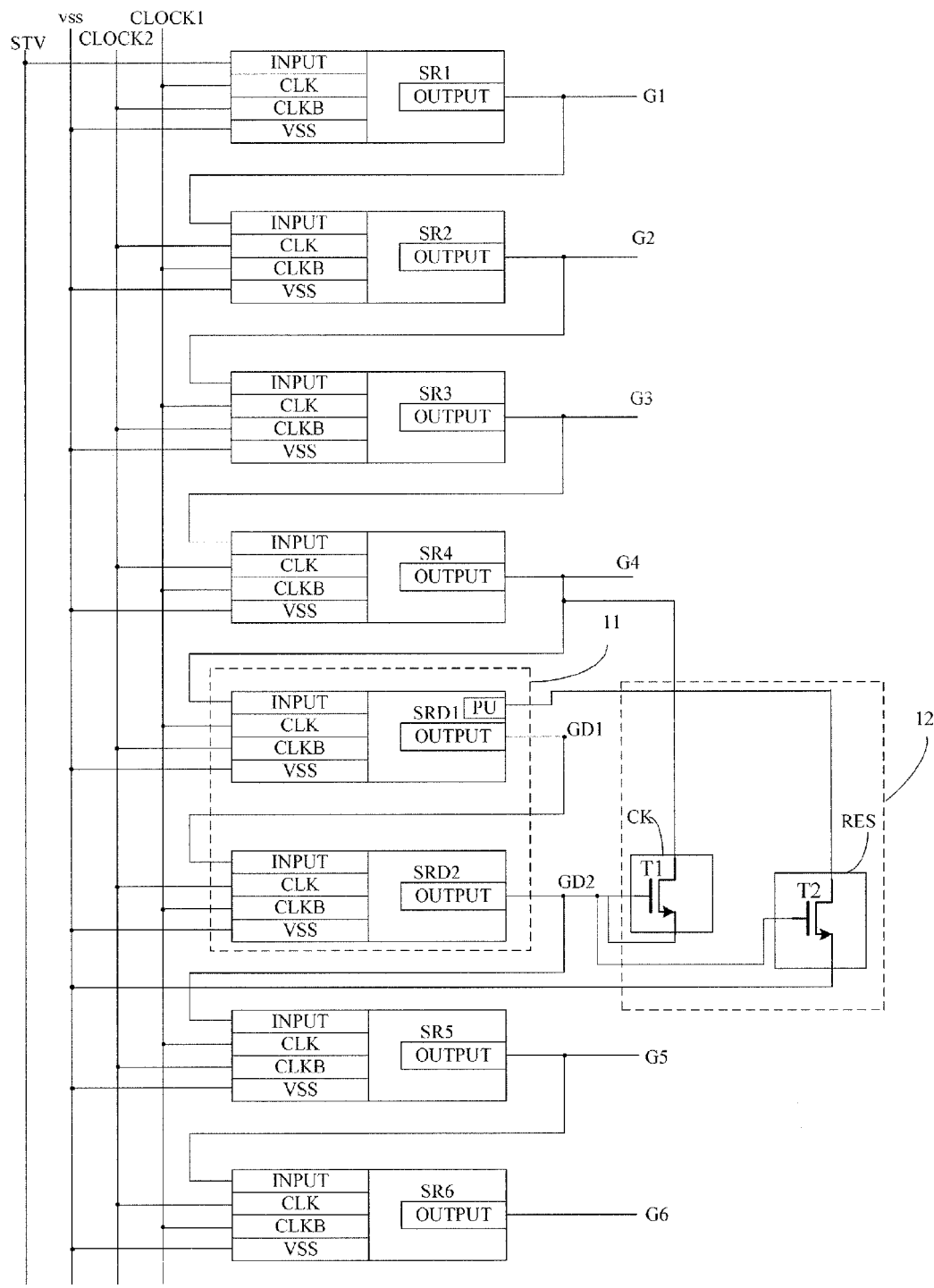
FIG. 3 is a schematic diagram of a structure of a gate driving circuit provided in yet another embodiment of the present disclosure.

Optionally, referring to FIG. 3, the repeat output module 12 comprises an output unit CK and a pulling-down unit RES.

The shift delay module 11 comprises i virtual shift register units connected in series, wherein an input terminal of the first stage of virtual shift register is connected to the output terminal of the j-th stage of shift register unit, and an output terminal of the i-th stage of virtual shift register is connected to the pulling-down unit RSE of the repeat output module 12, the output unit CK and the input terminal of the (j+1)-th stage of the shift register unit , where i is equal to 2. It is needed to specify that i may also be greater than 2, but just two virtual shift register units can implement the function of shift delaying.

The output unit CK is used for outputting the repeat scanning signal to the output terminal of the (j−n+1)-th stage of shift register unit (the shift register unit SR4 in FIG. 3), where n is equal to 1;

the pulling-down unit RES is further connected to the reference level terminal and an output control terminal of the first stage of virtual shift register and used for controlling the first stage of virtual shift register unit through the voltage at the reference level terminal to output a signal to the next stage of virtual shift register unit, so as to control the output terminal of the i-th stage of virtual shift register unit to stop outputting the repeat scanning signal through the output unit to the output terminal of the (j−n+1)-th stage of shift register unit.

Referring to FIG. 3, the output unit CK comprises a first switch transistor T1, whose gate and source are connected to the shift delay module and drain is connected to the output terminal of the j-th stage of shift register unit;

the pulling-down unit RES comprises a second switch transistor T2, whose gate is connected to an output terminal of the second stage of virtual shift register unit, source connected to the reference level terminal and drain is connected to a gate of a driving signal output transistor of a gate line in the first stage of virtual shift register unit, i.e., PU node.

Figure 4:
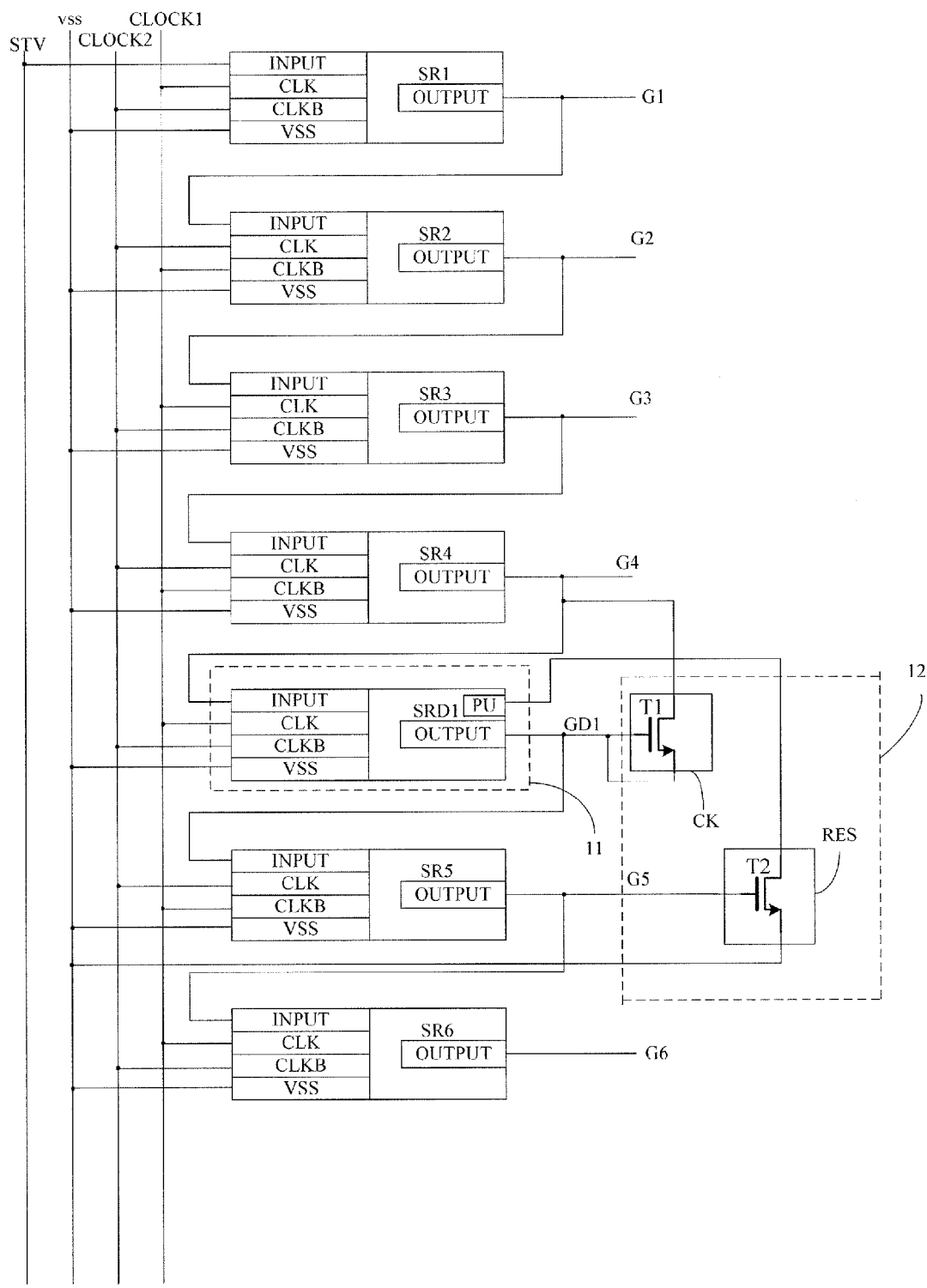
FIG. 4 is a schematic diagram of a structure of a gate driving circuit provided in yet another embodiment of the present disclosure.

Optionally, referring to FIG. 4, when n is equal to 1 (that is, the shift delay module 11 only comprises a virtual shift register unit SRD1), the repeat output module 12 is further connected to the reference level terminal and the output terminal of the (j+1)-th stage of shift register unit and used for controlling the repeat output module to stop outputting the repeat scanning signal to the output terminal of the j-th stage of shift register unit through the voltage at the reference level terminal when the (j+1)-th stage of shift register unit outputs the scanning signal.

Optionally, the repeat output module 12 comprises an output unit CK and a pulling-down unit RES;

the shift delay module 11 comprises a first stage of virtual shift register unit, whose input terminal is connected to the output terminal of the j-th stage of shift register unit and output terminal is connected to the output unit CK of the repeat output module 12 and the input terminal of the (j+1)-th stage of shift register unit.

At this time, the output unit CK is used for outputting the repeat scanning signal to the output terminal of the j-th stage of shift register unit;

the pulling-down unit RES is further connected to the reference level terminal, the output terminal of the (j+1)-th stage of shift register unit and the output control terminal PU of the first stage of virtual shift register unit and used for controlling the first stage of virtual shift register unit to stop outputting the repeat scanning signal to the output terminal of the j-th stage of shift register unit through the voltage at the reference level terminal when the (j+1)-th stage of shift register unit outputs the scanning signal.

Specifically, the output unit CK comprises a first switch transistor T1, whose gate and source are connected to the shift delay module, and drain is connected to the output terminal of the j-th stage of shift register unit;

the pulling-down unit RES comprises a second switch transistor T2, whose gate is connected to the output terminal of the (j+1)-th stage of shift register unit, source connected to the reference level terminal, and drain connected to the output control terminal PU of the first stage of virtual shift register unit SRD1 (for example, a gate of a driving signal output transistor of a gate line in the first stage of virtual shift register unit).

In the embodiment as shown in FIG. 4, the shift delay module 11 only comprises a virtual shift register unit SRD1. The repeat output of the scanning signal on the gate line G4 after the touch time terminates is realized through outputting the repeat scanning signal to the output terminal of the shift register unit SR4.

Figure 5:
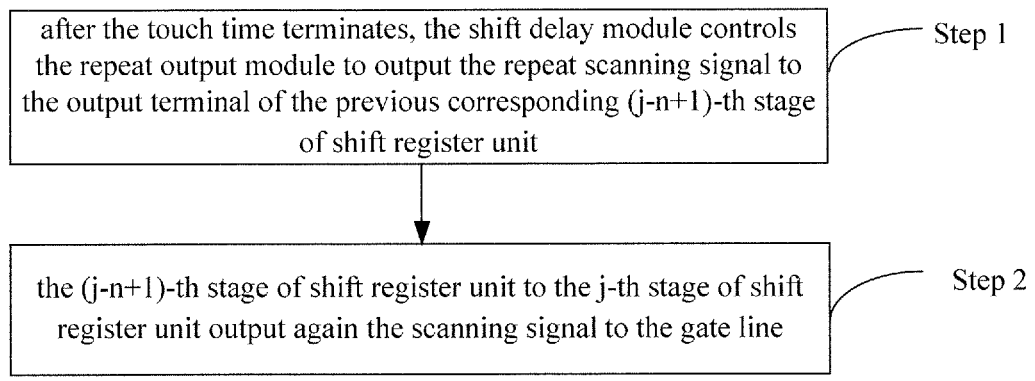
FIG. 5 is a schematic diagram of a flow of a gate driving method provided in an embodiment of the present disclosure.

As shown in FIG. 5, the gate driving method of the embodiment of the present disclosure comprises:

Step 1: controlling the repeat output module to output the repeat scanning signal to the output terminal of the previous corresponding (j−n+1)-th stage of shift register unit by the shift delay module after the touch time terminates;

step 2: outputting again the scanning signals to the gate lines by the (j−n+1)-th stage of shift register unit to the j-th stage of shift register unit.

Optionally, the method further comprises step 3, after the j-th stage of shift register unit outputs again the scanning signal or the (j+1)-th stage of shift register unit outputs the scanning signal, the repeat output module stops outputting the repeat scanning signal to the output terminal of the (j−n+1)-th stage of shift register unit.

According to the gate driving method of the embodiment of the present disclosure, after the touching stage terminates, the repeat output module can be controlled through the shift delay unit to repeatedly output the gate driving signal of the gate driving shift register unit before the touching stage, so as to solve the technical problem of undesirable display caused by the scanning signal interrupt in the time-sharing driven touch screen technology.

Specifically, referring to the gate driving circuit as shown in FIG. 2 and the timing diagram of the operation of the gate driving circuit provided in FIG. 6, the operating process of the gate driving method of the embodiment of the present disclosure is as follows:

STV is a start signal. Each stage of shift register (comprising the shift register unit and the virtual shift register unit provided in the embodiment of the present disclosure) takes the output signal at the output terminal of the previous stage of the shift register as the start signal and operates under dual clock (CLOCK1 and CLOCK2). The first four shift register units SR1, SR2, SR3 and SR4 realize the gate-driven scanning output G1, G2, G3 and G4 from top to bottom, and then the clock signal stops to enter into the touch time.

When the touch time terminates, the clock signal restarts. When CLOCK1 is high, the output terminal of the virtual shift register unit SRD1 outputs a high level at GD1; T1 is turned on while GD1 outputs the high level, and the high level signal of GD1 is transmitted to G3. At this time, G3 is also at the high level, and repeat scanning for the gate line G3 corresponding to SR3 is thus realized, the signal at the gate line G3 is taken as the input signal of SR4, and SR4 outputs again the scanning signal to the gate line G4 when the next clock comes, so that the repeat output for the gate lines G3 and G4 is realized. Herein, it needs to particularly specify that the output signals of GD1 and GD2 are not accessed to the pixel region, thereby making no affect on the pixel display.

Next, GD2 is taken as the start signal of SR5 to make G5 output the high level. Then, SR5, SR6 and SR7 in turn output the high level signal to successively realize the scanning of G5, G6 and G7 . . .

When both G4 and GD2 are at the high level, in order to prevent GDT from being pulled up by G4 again, i.e., in order to prevent GD1 and GD2 from being outputted repeatedly, the embodiment of the present disclosure pulls down the PU terminal of SRD1 by T2 to prevent GD1 from outputting again the high level.

Figure 7:
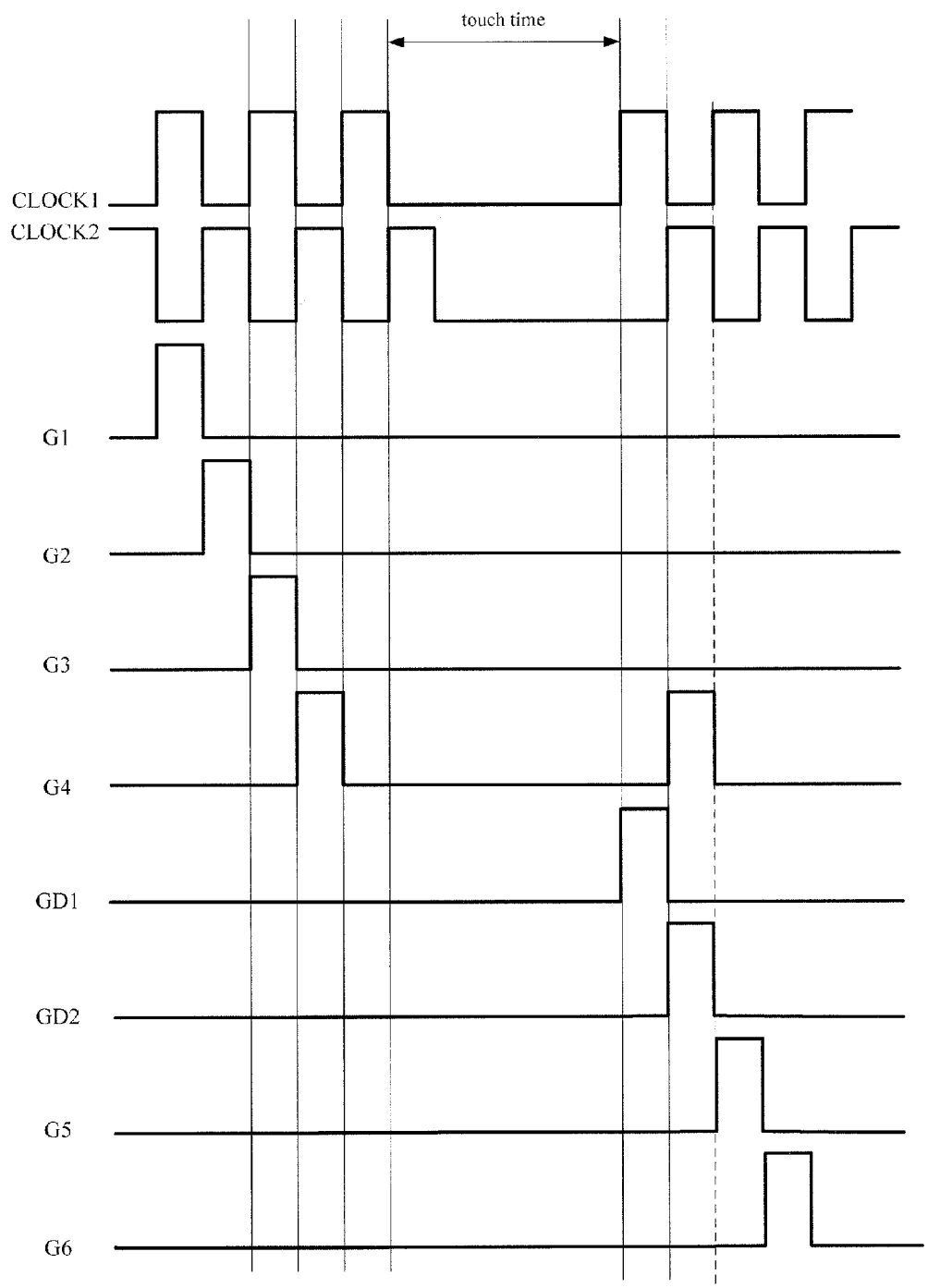
FIG. 7 is a schematic diagram of an output timing state of a gate driving method provided in another embodiment of the present disclosure.

Specifically, referring to the gate driving circuit as shown in FIG. 3 and the operating timing diagram of the gate driving circuit as shown in FIG. 7, the operation process of the gate driving method of the embodiment of the present disclosure is as follows:

STV is a start signal. Each stage of shift register (comprising the shift register units and the virtual shift register units provided in the embodiment of the present disclosure) takes the output signal at the output terminal of the previous stage of the shift register as the start signal and operates under dual clock (CLOCK1 and CLOCK2). The first four shift register units SR1, SR2, SR3 and SR4 realize the gate-driven scanning output G1, G2, G3 and G4 from top to bottom, and then the clock signal stops to enter into the touch time.

When the touch time terminates, the clock signal restarts. When CLOCK1 is high, the output terminal of the virtual shift register unit SRD1 outputs a high level at GD1; GD1 outputs a high level to be taken as the input signal of the virtual shift register unit SRD2, the virtual shift register unit SRD2 outputs the high level at GD2 when the next clock comes, and the high level signal of GD2 is transmitted to G4. At this time, G4 is also at the high level, and the repeat scanning for the gate line G4 corresponding to SR4 is thus realized. Herein, it needs to particularly specify that the output signals of GD1 and GD2 are not accessed to the pixel region, thereby making no influence on the pixel display.

Next, GD2 is taken as the start signal of SR5 to make G5 output the high level. Then, SR5, SR6 and SR7 in turn output the high level signal to successively realize the scanning of G5, G6 and G7 . . .

When both G4 and GD2 are at the high level, in order to prevent GD1 from being pulled up by G4 again, i.e., in order to prevent GD1 and GD2 from being outputted repeatedly, the embodiment of the present disclosure pulls down the PU terminal of SRD1 by T2 to prevent GD1 from outputting the high level again.

Figure 8:
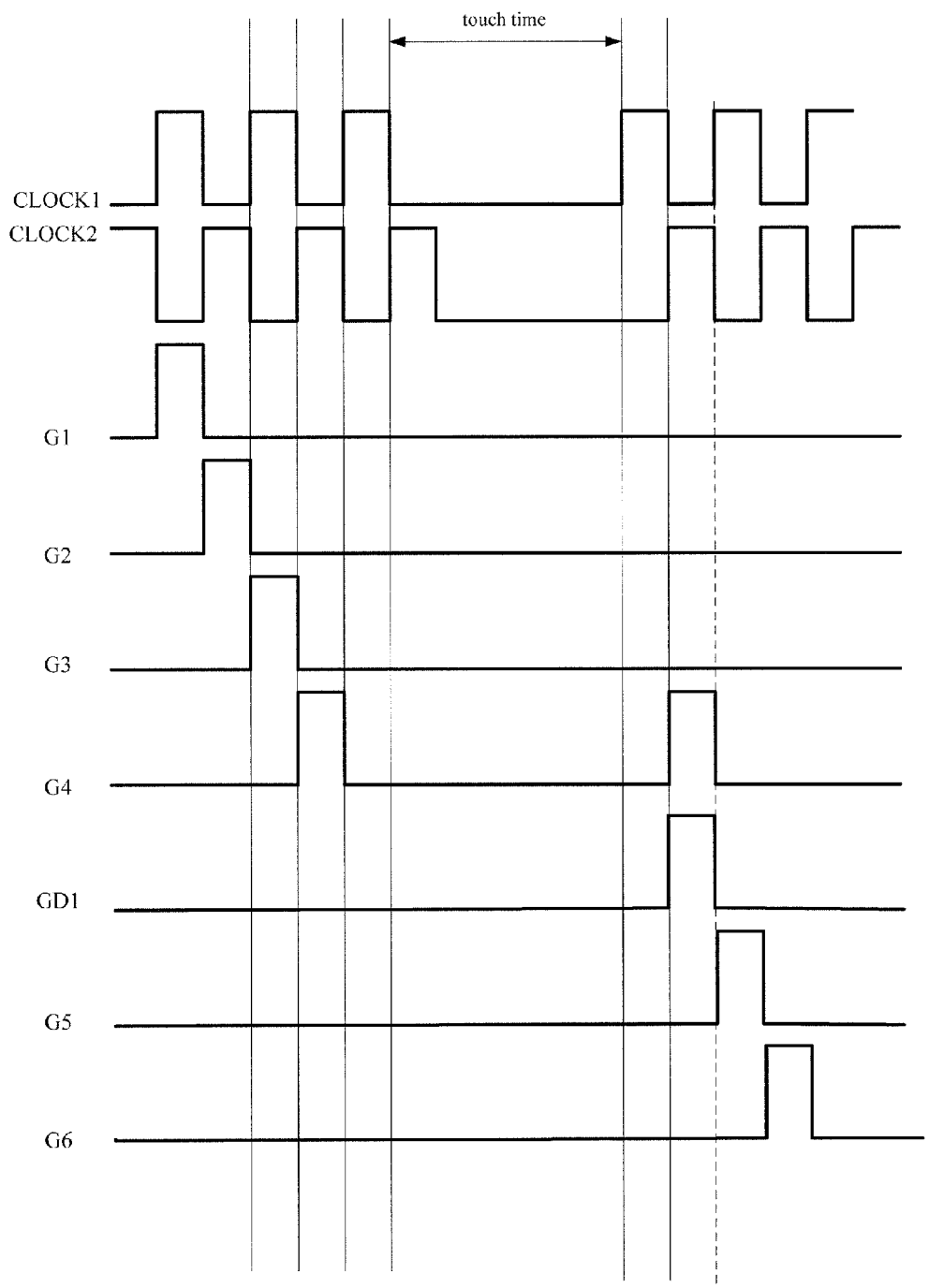
FIG. 8 is a schematic diagram of an output timing state of a gate driving method provided in another embodiment of the present disclosure.

Specifically, referring to the gate driving circuit as shown in FIG. 4 and the timing diagram of the operation of the gate driving circuit provided in FIG. 8, the operating process of the gate driving method of the embodiment of the present disclosure is as follows:

STV is a start signal. Each stage of shift register (comprising the shift register unit and the virtual shift register unit provided in the embodiment of the present disclosure) takes the output signal at the output terminal of the previous stage of the shift register as the start signal and operates under dual clock (CLOCK1 and CLOCK2). The first four shift register units SR1, SR2, SR3 and SR4 realize the gate-driven scanning output G1, G2, G3 and G4 from top to bottom, and then the clock signal stops to enter into the touch time.

When the touch time terminates, the clock signal restarts. When CLOCK1 is high, the output terminal of the virtual shift register unit SRD1 outputs a high level at the GD1; T1 is turned on while GD1 outputs the high level, and the high level signal of GD1 is transmitted to G4. At this time, G4 is also at the high level, and a repeat scanning for the gate line G4 corresponding to SR4 is thus realized. Herein, it needs to particularly specify that the output signal of GD1 is not accessed to the pixel region, thereby making no affect on the pixel display.

Next, GD2 is taken as the start signal of SR5 to make G5 output the high level. Then, SR5, SR6 and SR7 in turn output the high level signal to successively realize the scanning of G5, G6 and G7 . . .

When G5 is at the high level, in order to prevent GD1 from being pulled up again by G4, i.e., in order to prevent the present disclosure from pulling down the PU terminal of SRD1 by T2 so as to prevent GD1 from outputting again the high level.

The above illustrations just take the scanning signal at the high level as an example. At this time, the corresponding switch transistors are all turned on at the high level. Similarly, according to the internal structure of the shift register and the voltage requirement for the pixel unit when the display device is designed, the scanning signal can also be realized at low level, and at this time, the corresponding switch transistors are turned on at the low level.

There further provides in the embodiment of the present disclosure a display device comprising the gate driving circuit described above.

The gate driving circuit and the gate line driving method provided in the present embodiments of the present disclosure can control, after the touching stage terminates, the repeat output module through the shift delay unit to repeatedly output the gate driving signal of the gate driving shift register unit before the touching stage, so as to solve a technical problem of bad display caused by the scanning signal interrupt in the time-sharing driven touch screen technology.

The above descriptions are just specific embodiments of the present disclosure, but the protection scope of the present disclosure is not limited thereto. Modifications or replacements within the technical scope disclosed herein easily conceived by those skilled in the art who are familiar with the present technical field shall be fallen into the protection scope of the present disclosure. Therefore, the protection scope of the present disclosure shall be subject to the protection scope of the claims.

What is claimed is:

1. A gate driving circuit comprising multiple shift register units connected in series, wherein the gate driving circuit further comprising a shift delay module and a repeat output module, the shift delay module being connected in series between j-th stage of shift register unit and (j+1)-th stage of shift register unit which are adjacent, where j is a positive integer greater than 1;
    the shift delay module is connected to an output terminal of the j-th stage of shift register unit and an input terminal of the (j+1)-th stage of shift register unit and is further connected to the repeat output module;
    the repeat output module is connected to an output terminal of the (j−n+1)-th stage of shift register unit;
    the shift delay module is configured to control, after a preset touch time terminates, the repeat output module to output a repeat scanning signal to the output terminal of the (j−n+1)-th stage of shift register unit after the j-th stage of shift register unit outputs a gate scanning signal, so that the scanning signals are output again to gate lines by the (j−n+1)-th stage of shift register unit to the j-th stage of shift register unit, where n is a positive integer greater than or equal to 1.

2. The gate driving circuit according to claim 1, wherein, the repeat output module is further connected to a reference level terminal and configured to control the repeat output module to stop outputting the repeat scanning signal to the output terminal of the (j−n+1)-th stage of shift register unit by a voltage at the reference level terminal when the j-th stage of shift register unit repeatedly outputs the scanning signal.

3. The gate driving circuit according to claim 2, wherein the repeat output module comprises an output unit and a pulling-down unit;
    the shift delay module comprises i virtual shift register units connected in series, in which an input terminal of the first stage of virtual shift register unit is connected to the output terminal of the j-th stage of shift register unit, an output terminal of the first stage of virtual shift register unit is connected to the output unit, and an output terminal of the i-th stage of virtual shift register unit is connected to the pulling-down unit and the input terminal of the (j+1)-th stage of shift register unit, where i is equal to n and is a positive integer greater than 1;
    wherein the output unit is configured to output the repeat scanning signal to the output terminal of the (j−n+1)-th stage of shift register unit;
    the pulling-down unit is further connected to the reference level terminal and an output control terminal of the first stage of virtual shift register unit, and configured to control by the voltage at the reference level terminal the first stage of virtual shift register unit to stop outputting the repeat scanning signal through the output unit to the (j−n+1)-th stage of shift register unit.

4. The gate driving circuit according to claim 3, wherein the output unit comprises a first switch transistor, whose gate and source are connected to the shift delay module and drain is connected to the output terminal of the j-th stage of shift register unit;
    the pulling-down unit comprises a second switch transistor, whose gate is connected to an output terminal of the n-th stage of virtual shift register unit, source is connected to the reference level terminal and drain is connected to a gate of a driving signal output transistor of a gate line in the first stage of virtual shift register unit.

5. The gate driving circuit according to claim 2, wherein the repeat output module comprises an output unit and a pulling-down unit;
    the shift delay module comprises i virtual shift register units connected in series, in which the input terminal of the first stage of virtual shift register unit is connected to the output terminal of the j-th stage of shift register unit, and an output terminal of the i-th stage of virtual shift register unit is connected to the pulling-down unit, the output unit and the input terminal of the (j+1)-th stage of shift register unit, where i is equal to 2;
    wherein the output unit is configured to output the repeat scanning signal to the output terminal of the (j−n+1)-th stage of shift register unit, where n is equal to 1;
    the pulling-down unit is further connected to the reference level terminal and the output control terminal of the first stage of virtual shift register unit, and configured to control by the voltage at the reference level terminal the first stage of virtual shift register unit to output a signal to the next stage of virtual shift register unit, so as to control the output terminal of the i-th stage of virtual shift register unit to stop outputting the repeat scanning signal through the output unit to the output terminal of the (j−n+1)-th stage of shift register unit.

6. The gate driving circuit according to claim 5, wherein the output unit comprises a first switch transistor, whose gate and source are connected to the shift delay module and drain is connected to the output terminal of the j-th stage of shift register unit;

the pulling-down unit comprises a second switch transistor, whose gate is connected to an output terminal of the n-th stage of virtual shift register unit, source is connected to the reference level terminal and drain is connected to a gate of a driving signal output transistor of a gate line in the first stage of virtual shift register unit.

7. The gate driving circuit according to claim 1, wherein, the repeat output module is further connected to the reference level terminal and the output terminal of the (j+1)-th stage of shift register unit, and configured to control by the voltage at the reference level terminal the repeat output module to stop outputting the repeat scanning signal to the output terminal of the j-th stage of shift register unit when the (j+1)-th stage of shift register unit outputs the scanning signal.

8. The gate driving circuit according to claim 7, wherein the repeat output module comprises an output unit and a pulling-down unit;
the shift delay module comprises a first stage of virtual shift register unit, whose input terminal is connected to the output terminal of the j-th stage of shift register unit and output terminal is connected to the output unit and the input terminal of the (j+1)-th stage of shift register unit;
wherein the output unit is configured to output the repeat scanning signal to the output terminal of the j-th stage of shift register unit;
the pulling-down unit is further connected to the reference level terminal, the output terminal of the (j+1)-th stage of shift register unit and the output control terminal of the first stage of virtual shift register unit, and configured to control by the voltage at the reference level terminal the first stage of virtual shift register unit to stop outputting the repeat scanning signal to the output terminal of the j-th stage of shift register unit when the (j+1)-th stage of shift register unit outputs the scanning signal.

9. The gate driving circuit according to claim 8, wherein the output unit comprises a first switch transistor, whose gate and source are connected to the shift delay module and drain is connected to the output terminal of the j-th stage of shift register unit;
the pulling-down unit comprises a second switch transistor, whose gate is connected to the output terminal of the (j+1)-th stage of shift register unit, source connected to the reference level terminal and drain is connected to a gate of a driving signal output transistor of a gate line in the first stage of virtual shift register unit.

10. A display device comprising the gate driving circuit according to claim 1.

11. The gate driving circuit according to claim 10, wherein,
the repeat output module is further connected to a reference level terminal and configured to control the repeat output module to stop outputting the repeat scanning signal to the output terminal of the (j−n+1)-th stage of shift register unit by a voltage at the reference level terminal when the j-th stage of shift register unit repeatedly outputs the scanning signal.

12. The gate driving circuit according to claim 11, wherein the repeat output module comprises an output unit and a pulling-down unit;
the shift delay module comprises i virtual shift register units connected in series, in which an input terminal of the first stage of virtual shift register unit is connected to the output terminal of the j-th stage of shift register unit, an output terminal of the first stage of virtual shift register unit is connected to the output unit, and an output terminal of the i-th stage of virtual shift register unit is connected to the pulling-down unit and the input terminal of the (j+1)-th stage of shift register unit, where i is equal to n and is a positive integer greater than 1;
wherein the output unit is configured to output the repeat scanning signal to the output terminal of the (j−n+1)-th stage of shift register unit;
the pulling-down unit is further connected to the reference level terminal and an output control terminal of the first stage of virtual shift register unit and configured to control by the voltage at the reference level terminal the first stage of virtual shift register unit to stop outputting the repeat scanning signal through the output unit to the (j−n+1)-th stage of shift register unit.

13. The gate driving circuit according to claim 11, wherein the repeat output module comprises an output unit and a pulling-down unit;
the shift delay module comprises i virtual shift register units connected in series, in which the input terminal of the first stage of virtual shift register unit is connected to the output terminal of the j-th stage of shift register unit, and an output terminal of the i-th stage of virtual shift register unit is connected to the pulling-down unit, the output unit and the input terminal of the (j+1)-th stage of shift register unit, where i is equal to 2;
wherein the output unit is configured to output the repeat scanning signal to the output terminal of the (j−n+1)-th stage of shift register unit, where n is equal to 1;
the pulling-down unit is further connected to the reference level terminal and the output control terminal of the first stage of virtual shift register unit, and configured to control by the voltage at the reference level terminal the first stage of virtual shift register unit to output a signal to the next stage of virtual shift register unit, so as to control the output terminal of the i-th stage of virtual shift register unit to stop outputting the repeat scanning signal through the output unit to the output terminal of the (j−n+1)-th stage of shift register unit.

14. The gate driving circuit according to claim 13, wherein the output unit comprises a first switch transistor, whose gate and source are connected to the shift delay module and drain is connected to the output terminal of the j-th stage of shift register unit;
the pulling-down unit comprises a second switch transistor, whose gate is connected to an output terminal of the n-th stage of virtual shift register unit, source is connected to the reference level terminal and drain is connected to a gate of a driving signal output transistor of a gate line in the first stage of virtual shift register unit.

15. The gate driving circuit according to claim 10, wherein,
the repeat output module is further connected to the reference level terminal and the output terminal of the (j+1)-th stage of shift register unit, and configured to control by the voltage at the reference level terminal the repeat output module to stop outputting the repeat scanning signal to the output terminal of the j-th stage of shift register unit when the (j+1)-th stage of shift register unit outputs the scanning signal.

16. The gate driving circuit according to claim 15, wherein the repeat output module comprises an output unit and a pulling-down unit;

the shift delay module comprises a first stage of virtual shift register unit, whose input terminal is connected to the output terminal of the j-th stage of shift register unit and output terminal is connected to the output unit and the input terminal of the (j+1)-th stage of shift register unit;

wherein the output unit is configured to output the repeat scanning signal to the output terminal of the j-th stage of shift register unit;

the pulling-down unit is further connected to the reference level terminal, the output terminal of the (j+1)-th stage of shift register unit and the output control terminal of the first stage of virtual shift register unit, and configured to control by the voltage at the reference level terminal the first stage of virtual shift register unit to stop outputting the repeat scanning signal to the output terminal of the j-th stage of shift register unit when the (j+1)-th stage of shift register unit outputs the scanning signal.

17. The gate driving circuit according to claim 16, wherein the output unit comprises a first switch transistor, whose gate and source are connected to the shift delay module and drain is connected to the output terminal of the j-th stage of shift register unit;

the pulling-down unit comprises a second switch transistor, whose gate is connected to the output terminal of the (j+1)-th stage of shift register unit, source connected to the reference level terminal and drain is connected to a gate of a driving signal output transistor of a gate line in the first stage of virtual shift register unit.

18. A gate line driving method of a gate driving circuit in which a shift delay module is located between j-th stage of shift register unit and (j+1)-th stage of shift register unit which are adjacent, comprising the steps of:

controlling by the shift delay module a repeat output module to output a repeat scanning signal to an output terminal of a previous corresponding (j−n+1)-th stage of shift register unit after a touch time terminates; and outputting again the scanning signal to a gate line by the (j−n+1)-th stage of shift register unit to the j-th stage of shift register unit;

where j is a positive integer greater than 1.

19. The method according to claim 18, wherein stopping by the repeat output module the output of the repeat scanning signal to the output terminal of the (j−n+1)-th stage of shift register unit after the j-th stage of shift register unit outputs again the scanning signal.

20. The method according to claim 18, wherein stopping by the repeat output module the output of the repeat scanning signal to the output terminal of the (j−n+1)-th stage of shift register unit after the (j+1)-th stage of shift register unit outputs the scanning signal.

* * * * *